United States Patent
Yoshida et al.

(10) Patent No.: US 7,679,202 B2
(45) Date of Patent: Mar. 16, 2010

(54) SEMICONDUCTOR DEVICE HAVING SYMBOL PATTERN UTILIZED AS IDENTIFICATION SIGN

(75) Inventors: Shigeki Yoshida, Kanagawa (JP); Fumio Ushida, Kanagawa (JP); Nobuhisa Naori, Kanagawa (JP); Yasutaka Ozaki, Kanagawa (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/790,123

(22) Filed: Apr. 24, 2007

(65) Prior Publication Data

US 2007/0296091 A1    Dec. 27, 2007

(30) Foreign Application Priority Data

Jun. 22, 2006    (JP)    ............... 2006-172253

(51) Int. Cl.
  *H01L 23/544*    (2006.01)
  *H01L 21/304*    (2006.01)
  *H01L 21/76*    (2006.01)

(52) U.S. Cl. ............... 257/797; 257/E23.179; 257/E21.238; 438/401; 438/462

(58) Field of Classification Search ............... 257/797, 257/E23.179, E21.238; 438/462, 401
  See application file for complete search history.

(56) References Cited

U.S. PATENT DOCUMENTS 6,501,189 B1    12/2002    Kim et al.

2001/0048145 A1    12/2001    Takeuchi et al.
2005/0009298 A1*    1/2005    Suzuki et al. ............... 438/459

FOREIGN PATENT DOCUMENTS

| JP | 03-082051 A | 4/1991 |
| JP | 09-097827 A | 4/1997 |
| JP | 2003-306822 A | 11/2000 |
| JP | 2001-339049 A | 12/2001 |
| JP | 2005-181560 A | 7/2005 |

OTHER PUBLICATIONS

Korean Office Action dated Mar. 20, 2008, issued in corresponding Korean Patent Application No. 10-2007-0045531 and partial English translation.
Chinese Office Action dated Oct. 31, 2008 issued in corresponding Chinese Patent Application No. 200710104101.3.

* cited by examiner

*Primary Examiner*—Matthew Smith
*Assistant Examiner*—Walter H Swanson
(74) *Attorney, Agent, or Firm*—Fujitsu Patent Center

(57) ABSTRACT

A plurality of device patterns constituting part of an electronic circuit are formed over the surface of a substrate. A symbol pattern to be used for an identification sign is formed in the same layer as the device patterns. A width of the device pattern is within a pattern width range on a design rule. The symbol pattern is formed by a plurality of isolated element patterns. The element pattern is either a linear pattern or a dot pattern. A width of the element pattern is equal to or larger than 0.8 time a lower limit value of the pattern width range and equal to or smaller than 1.2 times an upper limit value of the pattern width range.

7 Claims, 12 Drawing Sheets

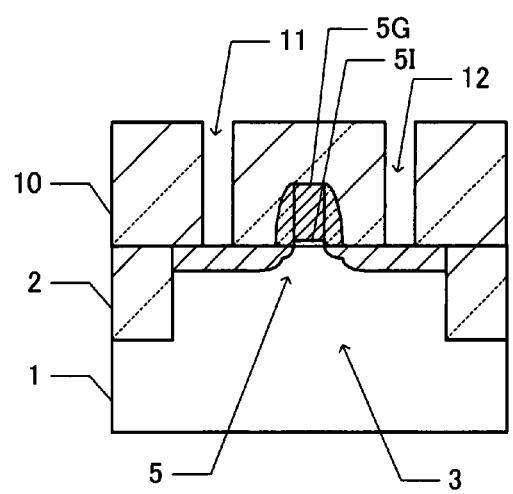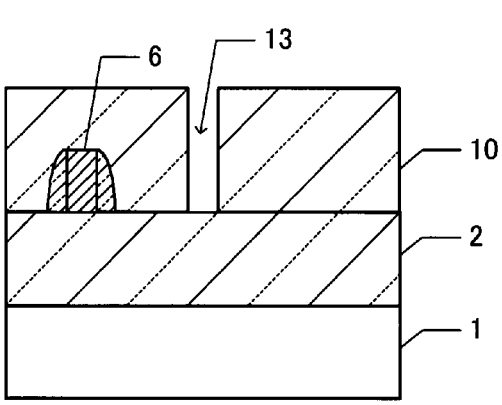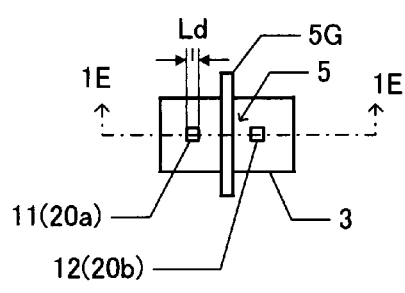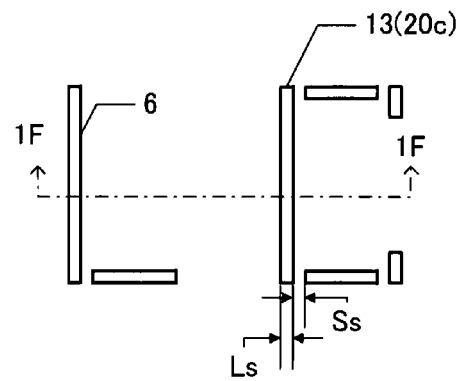

FIG.2A  FIG.2B  FIG.2C  FIG.2D
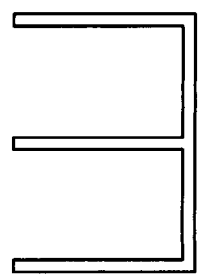 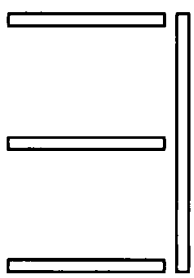 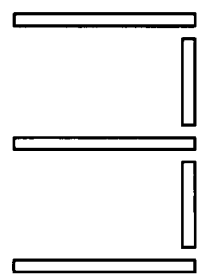 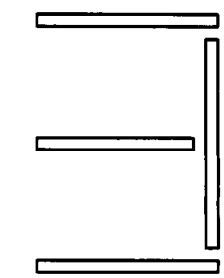
FIG.2E  FIG.2F  FIG.2G  FIG.2H
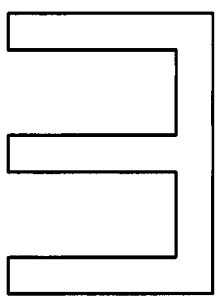 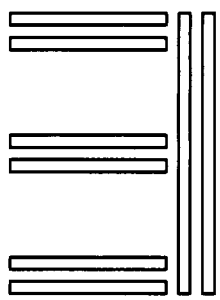 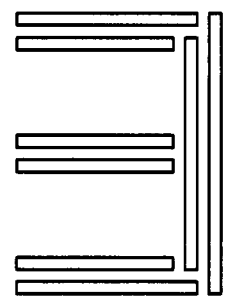 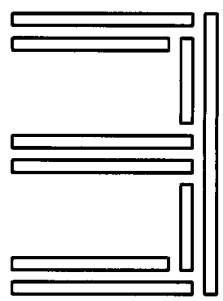
FIG.2I  FIG.2J  FIG.2K
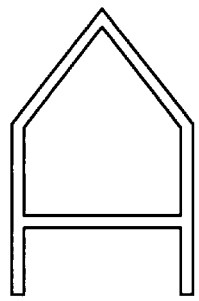 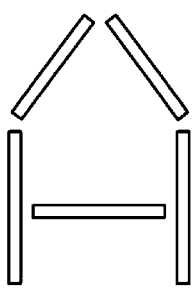 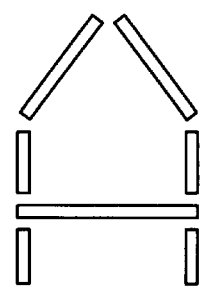
FIG.2L  FIG.2M  FIG.2N
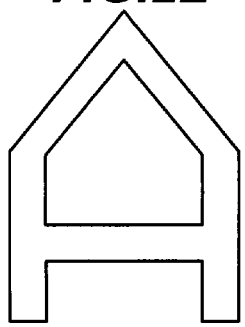 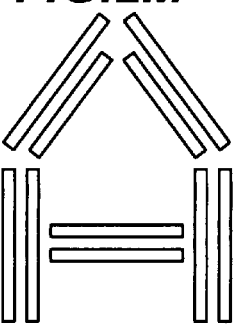 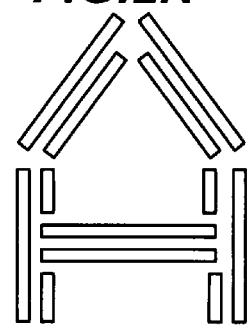

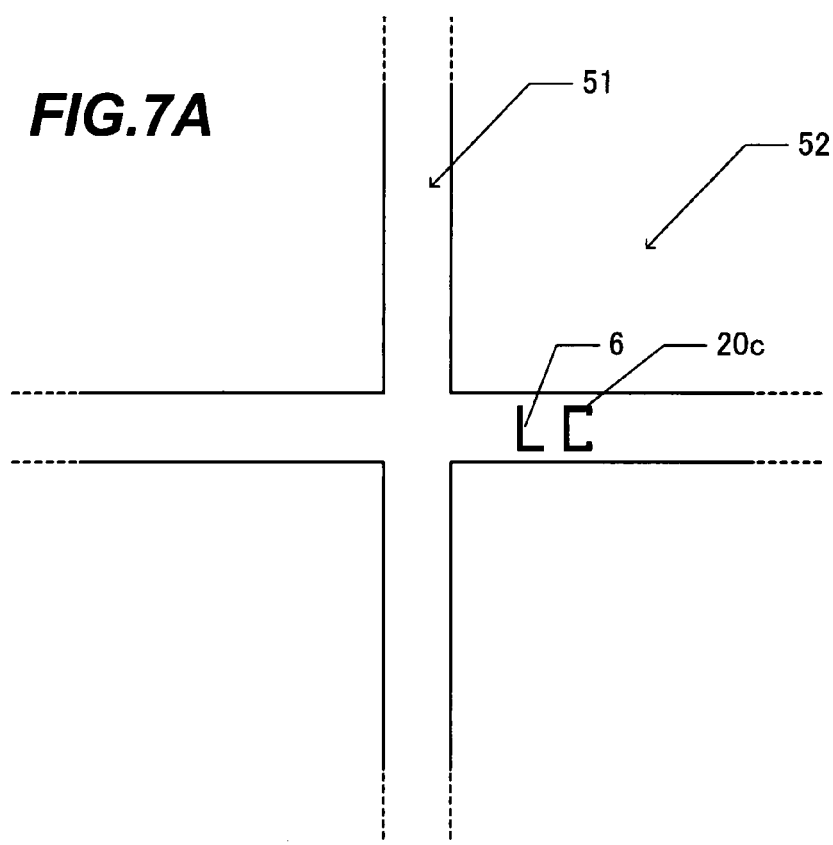
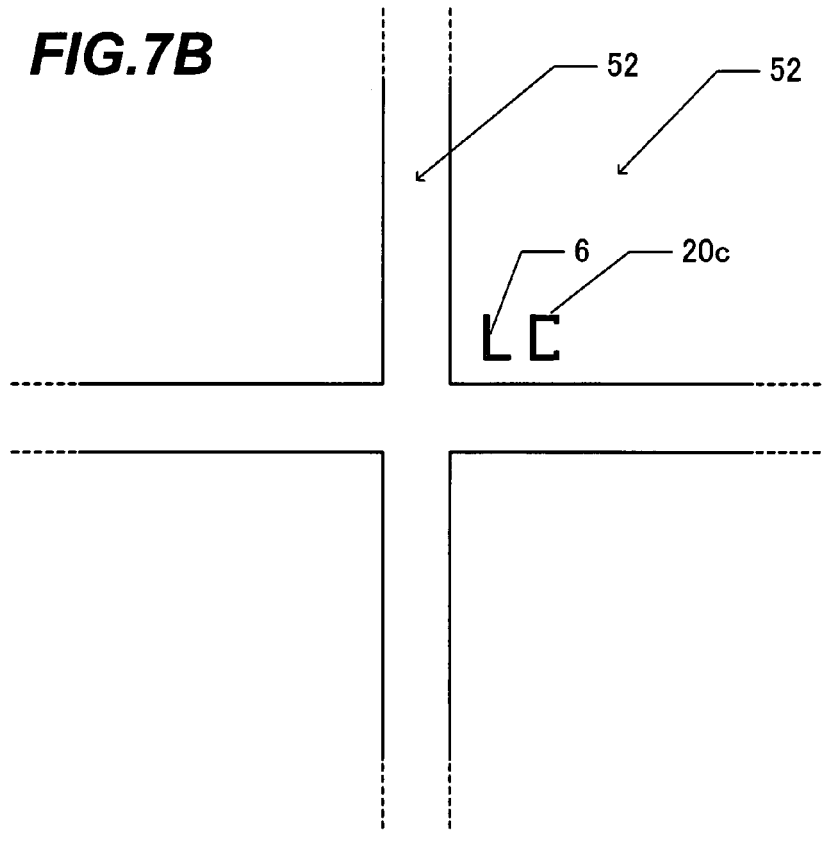

Conventional Art
FIG.10A
Conventional Art
FIG.10B
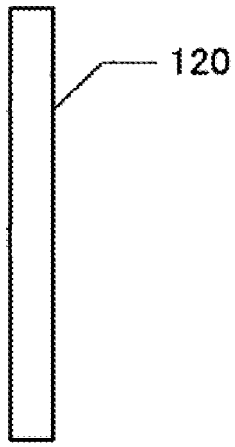
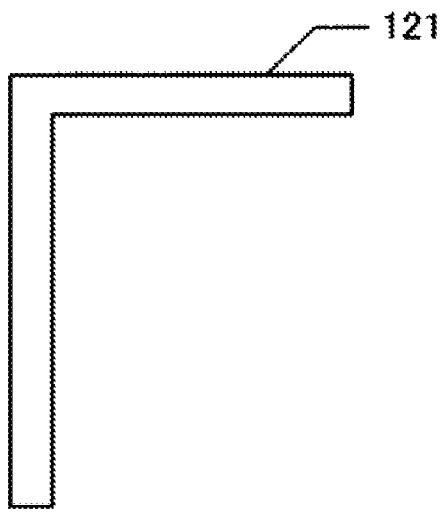
Conventional Art
FIG.10C
Conventional Art
FIG.10D
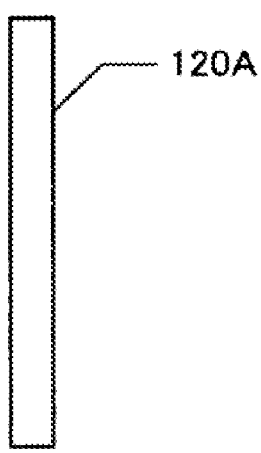
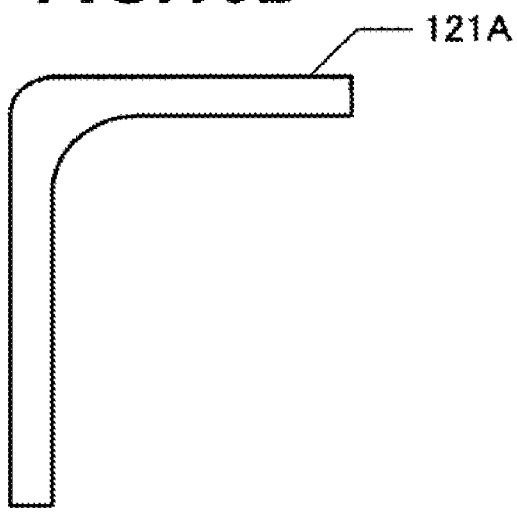

SEMICONDUCTOR DEVICE HAVING SYMBOL PATTERN UTILIZED AS IDENTIFICATION SIGN

CROSS REFERENCE TO RELATED APPLICATION

This application is based on and claims priority of Japanese Patent Application No. 2006-172253 filed on Jun. 22, 2006, the entire contents of which are incorporated herein by reference.

BACKGROUND OF THE INVENTION

A) Field of the Invention

The present invention relates to a semiconductor device having a symbol pattern utilized as an identification sign for wafers, chips, processes and the like, and its manufacture method.

B) Description of the Related Art

In the manufacture of semiconductor devices, symbol patterns such as characters are formed in a semiconductor chip or in a scribe line, at the same time when device patterns are formed in order for process control, product control or the like. This symbol pattern is observed with a microscope or the like during or after manufacture to be utilized as an identification sign for products and processes.

JP-A-HEI-3-82051 discloses a semiconductor device manufacture method capable of identifying the location of each chip separated from one wafer, by affixing symbols different from chip to chip in the wafer.

JP-A-2000-306822 discloses a semiconductor device manufacture method capable of recognizing an alignment mark even after a chemical mechanical polishing (CMP) process by forming the alignment mark composed of a plurality of dot patterns.

JP-A-2005-181560 discloses a semiconductor device manufacture method capable of suppressing generation of cracks by forming a symbol pattern having a size visually recognizable by disposing lines thinner than the lines constituting an original pattern of an identification sign, or by disposing small dots.

SUMMARY OF THE INVENTION

The line width and shape of each symbol pattern utilized as an identification sign have been determined conventionally with high priority on visibility. The advance of miniaturization of device patterns constituting part of an electronic circuit has made a line width of a symbol pattern wider than that of a device pattern in the same layer. A symbol pattern may contain a design element not contained in a device pattern. For example, when a via hole in which a conductive plug is buried is formed to connect upper and lower wirings, design elements of a device pattern contain only rectangles or squares, whereas a symbol pattern contains in some cases design elements of a T-character shape or a cross shape.

The conditions of a series of wafer processes for forming a device pattern, such as exposure, etching, film forming and CMP, are optimized with respect to the size and shape of the device pattern. Various problems therefore occur if the size and shape of a symbol pattern to be formed at the same time when a device pattern is formed are greatly different from the size and shape of the device pattern. Examples of these problems will be described with reference to FIGS. 9A to 10D.

With reference to FIGS. 9A and 9D, description will be made on a problem which occurs when line width of a symbol pattern is different from that of a device pattern.

FIG. 9A is a cross sectional view of a substrate in a region where a device pattern is formed, and FIG. 9B is a cross sectional view of the substrate in a region where a symbol pattern is formed. An interlayer insulating film 101 is formed on a substrate 100. A via hole 105 for containing a conductive plug and a recess 106 corresponding to a symbol pattern are formed through the interlayer insulating film 101. A plan shape of the via hole 105 is, for example, a square having a side length of about 0.5 µm, and a line width of the recess 106 corresponding to the symbol pattern is about 2 µm.

A tungsten film 110 is deposited on the interlayer insulating film 101 under the condition that the inside of the via hole 105 is completely filled with the tungsten film 110. In this case, the inside of the recess 106 having a size larger than that of the via hole 105 is not completely filled with the tungsten film 110.

As shown in FIGS. 9C and 9D, an unnecessary portion of the tungsten film 110 is removed by chemical mechanical polishing (CMP). A conductive plug 110a of tungsten remains in the via hole 105, and a tungsten film 110b remains in the recess 106. Since the inside of the recess 106 is not completely filled with the tungsten film 110, a depression 111 is generated on the surface of the tungsten film 110b, reflecting the inner shape of the recess 106. Slurry and the like utilized during CMP sometimes remain in the depression 111, and are likely to have an adverse impact on the succeeding process. If a silicon oxide film or the like is deposited on the interlayer insulating film 101, the silicon oxide film is thinned at the step portion of the depression 111.

With reference to FIGS. 10A and 10B, description will be made on a problem which occurs when a symbol pattern contains a design element not contained in a device pattern.

As shown in FIGS. 10A and 10B, consider the case of forming a straight line device pattern 120 and a symbol pattern 121 bent at a right angle. A line width of the device pattern 120 is, for example, 0.5 µm. A line width of the straight portion of the symbol pattern 121 is the same as that of the device pattern 120. The exposure and development conditions when a resist film is exposed to form openings corresponding to the device pattern 120 and symbol pattern 121 are optimized so as to conform a shape of the device pattern 120 to a target shape thereof.

FIGS. 10C and 10D show examples of actually formed openings. An opening 120A for the device pattern 120 has generally the same shape as the target device pattern 120. However, an opening 121A for the symbol pattern 121 becomes wider than a target width at the position of the bending portion. As the bending portion of the symbol pattern 121 becomes wider than the target width, a depression is generated on the surface after CMP as described with reference to FIGS. 9B and 9D Since the portion to be bent essentially at a right angle is rounded, pattern recognition is degraded. If the exposure condition is determined so as to set the width of the bending portion to 0.5 µm, the straight line portion other than the bending portion becomes narrower than 0.5 µm.

An object of the present invention is to provide a semiconductor device capable of suppressing adverse effects upon processes after the symbol pattern forming process.

According to one aspect of the present invention, there is provided a semiconductor device comprising:

a plurality of device patterns constituting part of an electronic circuit formed over a surface of a substrate; and a symbol pattern to be used for an identification sign formed in a same layer as the device patterns, wherein a width of the device pattern is within a pattern width range on a design rule, the symbol pattern is formed by a plurality of isolated element patterns, the element pattern is either a linear pattern or a dot pattern, and a width of the element pattern is equal to or larger than 0.8 time a lower limit value of the pattern width range on the design rule and equal to or smaller than 1.2 times an upper limit value of the pattern width range on the design rule.

According to another aspect of the present invention, there is provided a method of manufacturing a semiconductor device comprising steps of:

forming recesses in a surface layer of a substrate, the recesses constituting a plurality of device patterns constituting part of an electronic circuit and a symbol pattern to be used for an identification sign;

depositing a conductive film on the substrate to filling the recesses; and removing the conductive film deposited on a flat surface of the substrate by chemical mechanical polishing to leave the conductive film in the recesses, wherein a width of the device pattern is within a pattern width range on a design rule, the symbol pattern is formed by a plurality of isolated element patterns, the element pattern is either a linear pattern or a dot pattern, and a width of the element pattern is equal to or larger than 0.8 time a lower limit value of the pattern width range on the design rule and equal to or smaller than 1.2 times an upper limit value of the pattern width range on the design rule.

The size of a symbol pattern is set to satisfy the above-described condition so that the symbol pattern can be formed at generally the same precision as that of the device pattern. It is therefore possible to suppress the generation of adverse effects to be caused by a defective shape of the symbol pattern.

BRIEF DESCRIPTION OF THE DRAWINGS

FIGS. 1E and 1F are cross sectional views of the device pattern region and symbol pattern region, respectively, during the manufacture of the semiconductor device according to the embodiment, and FIGS. 1G and 1H are plan views of the regions shown in FIGS. 1E and 1F, respectively.

FIGS. 2A, 2E, 2I and 2L are diagrams showing original patterns of an identification sign, FIGS. 2B to 2D are symbol patterns representative of the original pattern shown in FIG. 2A, FIGS. 2F to 2H are symbol patterns representative of the original pattern shown in FIG. 2E, FIGS. 2J and 2K are symbol patterns representative of the original pattern shown in FIG. 2I, and FIGS. 2M and 2N are symbol patterns representative of the original pattern shown in FIG. 2L.

FIGS. 7A and 7B are plan views of wafers showing regions where symbol patterns are disposed.

FIGS. 10A and 10B are diagrams showing a conventional device and symbol patterns, and FIGS. 10C and 10D are plan views of resist openings for forming the patterns shown in FIGS. 10A and 10B, respectively.

DESCRIPTION OF THE PREFERRED EMBODIMENTS

Figure 1A:
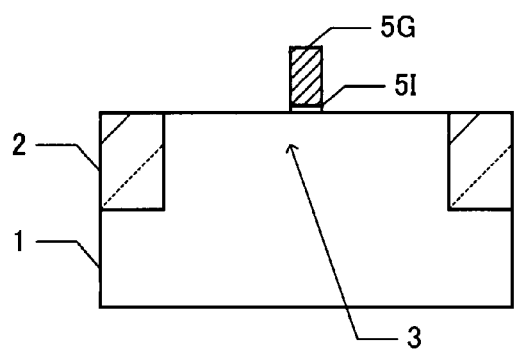
FIGS. 1A and 1B are cross sectional views of a device pattern region and a symbol pattern region, respectively, during the manufacture of a semiconductor device according to an embodiment.
Figure 1B:
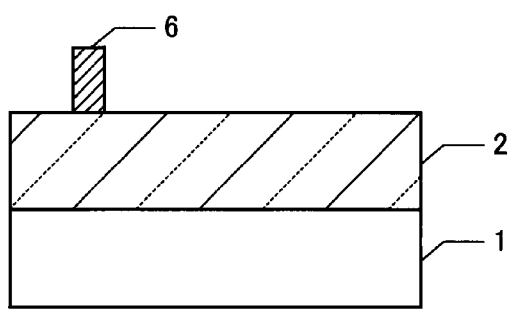
Figure 1C:
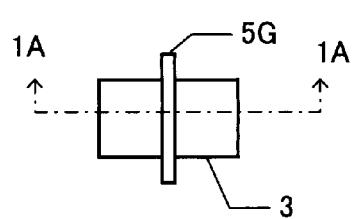
FIGS. 1C and 1D are plan views of the regions shown in FIGS. 1A and 1B, respectively.
Figure 1D:
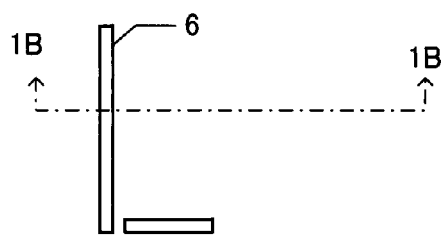
Figure 1I:
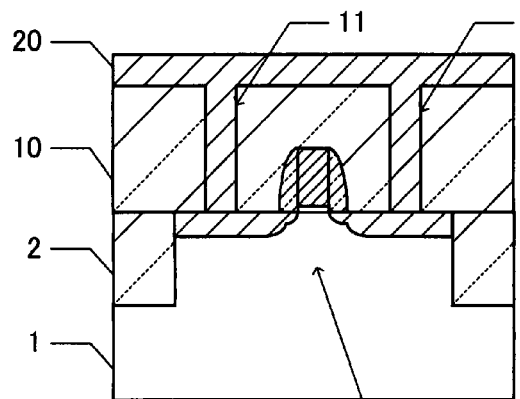
FIGS. 1I, 1K and 1M are cross sectional views of the device pattern region during the manufacture of the semiconductor device according to the embodiment.
Figure 1J:
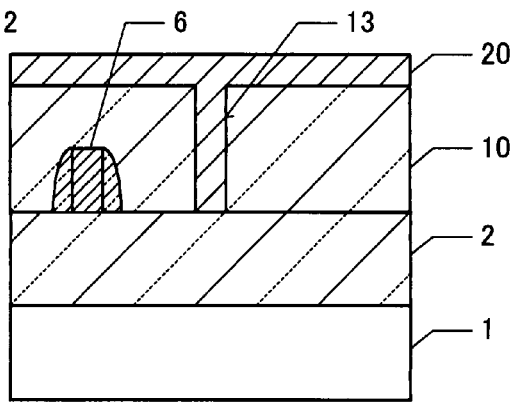
FIGS. 1J, 1L and 1N are cross sectional views of the symbol pattern region.
Figure 1K:
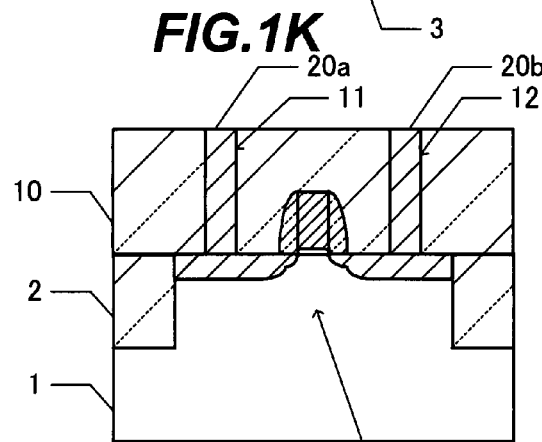
Figure 1L:
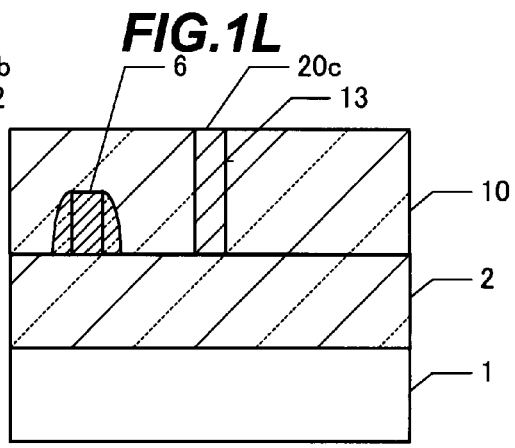
Figure 1M:
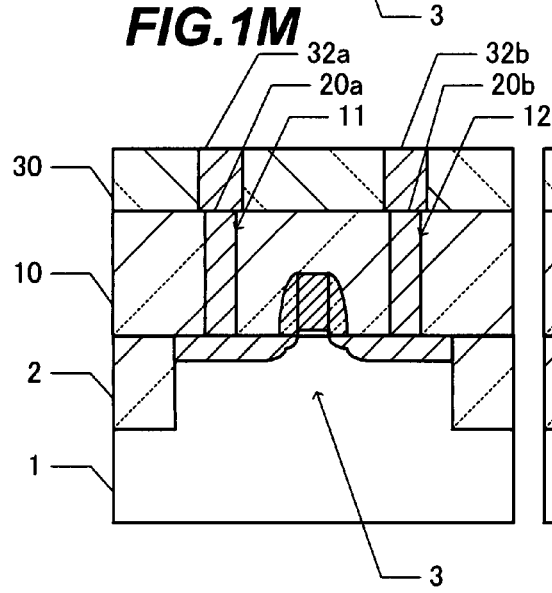
Figure 1N:
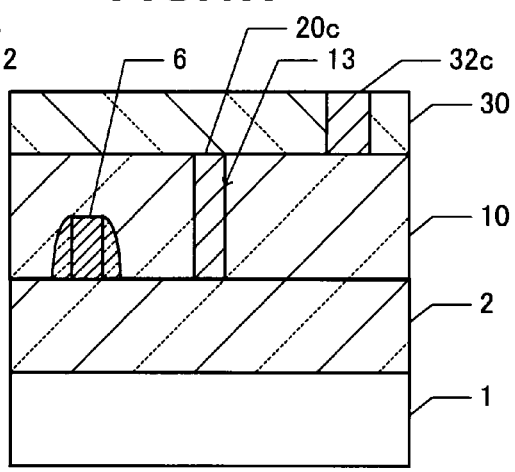

With reference to FIGS. 1A to 1N, description will be made on a semiconductor device manufacture method according to an embodiment.

FIGS. 1A and 1B are cross sectional views respectively showing regions of a substrate where a device pattern and a symbol pattern are disposed. FIGS. 1C and 1D are plan views of the regions shown in FIGS. 1A and 1B, respectively. FIGS. 1A and 1B are cross sectional views taken along one-dot chain lines 1A-IA and 1B-1B shown in FIGS. 1C and 1D, respectively.

An isolation insulating film 2 is formed in a surface layer of a semiconductor substrate 1 of silicon to define active regions 3. For example, the isolation insulating film 2 is formed by a shallow trench isolation (STI) method. A gate electrode 5G of polysilicon or the like is formed on a partial surface of the active region 3, intersecting with the active region 3. A gate insulating film 5I of silicon oxide or the like is disposed between the gate electrode 5G and semiconductor substrate 1.

In the symbol pattern region, a symbol pattern 6 of polysilicon is formed on the isolation insulating film 2. The symbol pattern 6 represents, for example, a letter "L", and is constituted of a straight line portion extending in a longitudinal direction and a straight line portion extending in a lateral direction. These two straight line portions are separated by a minute gap therebetween at the bending portion of the character "L".

As shown in FIG. 1E, a MOS transistor 5 is formed in the active region 3 by performing a process of forming extension regions through ion implantation, a process of forming sidewall spacers through chemical vapor deposition (CVD) and anisotropic etching, and a process of forming deep source/drain regions through ion implantation. In this case, as shown in FIG. 1F, sidewall spacers are formed also on sidewalls of the symbol pattern 6.

An interlayer insulating film 10 of silicon oxide or the like is formed covering the MOS transistor 5 and symbol pattern 6. Via holes 11 and 12 and a recess 13 to be filled with a symbol pattern are formed in the interlayer insulating film 10 by photolithography and etching techniques. Partial surfaces of the source/drain regions of the MOS transistor 5 are exposed on the bottoms of the via holes 11 and 12, respectively. A recess 13 to be filled with a symbol pattern is disposed near the symbol pattern 6 as shown in FIG. 1F.

FIGS. 1G and 1H are plan views of the regions shown in FIGS. 1E and 1F, respectively. FIG. 1E shows a cross sectional view taken along one-dot chain line 1E-1E shown in FIG. 1G, and FIG. 1F shows a cross sectional view taken along one-dot chain line 1F-1F shown in FIG. 1H.

As shown in FIG. 1G, the via holes 11 and 12 are disposed inside the source/drain regions of the MOS transistor 5, respectively, and have a plan shape of generally a square.

As shown in FIG. 1H, the recess 13 is constituted of five isolated element patterns each having a straight line plan shape. Five element patterns are disposed along each straight line portion of an original pattern representative of a letter "C" patterned only by straight lines. Two element patterns of the symbol pattern corresponding to two straight line portions defining a bending portion of the original pattern is separated from each other. A width (length of one side of a square) of a plan shape of each of the via holes 11 and 12 is represented by Ld, and a line width of each straight line element pattern constituting the recess 13 is represented by Ls. A distance between two element patterns proximate to each other is represented by Ss.

As shown in FIGS. 1I and 1J, a conductive film 20 of tungsten or the like is deposited on the interlayer insulating film 10 by CVD or the like to fill the via holes 11 and 12 and recess 13.

As shown in FIGS. 1K and 1L, the conductive film 20 is subjected to CMP until the surface of the interlayer insulating film 10 is exposed. Conductive plugs 20a and 20b made of the conductive film 20 therefore remain in the via holes 11 and 12. A symbol pattern 20c made of the conductive film 20 remains in the recess 13.

As shown in FIGS. 1M and 1N, another interlayer insulating film 30 is formed on the interlayer insulating film 10. The interlayer insulating film 30 has a lamination structure including an etching stopper film, a low dielectric constant (low-k) insulating material film, a cap film and the like. Wiring trenches are formed in the interlayer insulating film 30, and wirings 32a and 32b of copper (Cu) or the like fill the wiring trenches. The wirings 32a and 32b are connected to the conductive plugs 20a and 20b, respectively. At the same time when the wiring trenches are formed, a recess for a symbol pattern is also formed. A symbol pattern 32c of Cu fills the recess. The wirings 32a and 32b and symbol pattern 32c are formed by a process of forming a seed layer of Cu, an electrolytic copper plating process and a CMP process. The inner surfaces of the via holes and wiring trenches may be covered with a barrier metal film or a tight adhesion improving film, when necessary.

Description continues reverting to FIGS. 1G and 1H. The conductive plugs 20a and 20b fill the via holes 11 and 12. The symbol pattern 20c fills the recess 13.

The plan shape of the conductive plugs 20a and 20b is a square, and a length (width) Ld of each side is, for example, 0.5 μm. A line width Ls of a straight line element pattern constituting the symbol pattern 20c is about 0.5 μm approximately equal to the width of the conductive plugs 20a and 20b.

In the interlayer insulating film 10, only the conductive plugs are disposed as the device pattern constituting part of an electronic circuit, whereas in the interlayer insulating film 30 shown in FIGS. 1M and 1N, a straight line wiring is disposed as the device pattern. A pattern having the same sizes in longitudinal and lateral directions such as the conductive plug is called a dot pattern, and a pattern that is long in one direction such as the wiring is called a linear pattern. A range of a width of a device pattern capable of being formed (pattern width range on the design rule) and a minimum value between patterns (minimum interval on the design rule) are determined beforehand for each layer in which a device pattern is disposed.

The width Ld of the conductive plugs 11 and 12 shown in FIGS. 1E to 1H is equal to the lower limit value of the pattern width range on the design rule with respect to the interlayer insulating film 10. The line width of the wirings 32a and 32b shown in FIG. 1M is also equal to the lower limit value of the pattern width range on the design rule with respect to this layer. The width of each element pattern of the symbol pattern 20c shown in FIG. 1H and the width of each element pattern of the symbol pattern 32c shown in FIG. 1N are approximately equal to the lower limit value of the pattern width range on the design rule with respect to the same layer. As the width of each element pattern constituting the symbol pattern is set equal to the lower limit value of the pattern width range on the design rule in the manner described above, the upper surfaces of the symbol patterns 20c and 32c are flat as shown in FIGS. 1L and 1N, as in the case of the upper surfaces of the conductive plugs 11 and 12 and wirings 32a and 32b. It is therefore possible not to leave residues during CMP and to make uniform a thickness of a film to be deposited on the upper surface.

The symbol patterns 20c and 32c are constituted of only element patterns having straight line shape and do not contain bending portions and crossing portions. It is therefore possible to prevent the line width of the bending portion or crossing portion from becoming wider than the line width of the straight line portion.

It is preferable to set the minimum distance Ss between element patterns constituting the symbol pattern 13 shown in FIG. 1H approximately equal to the minimum interval on the design rule.

The width of the linear or spot element pattern constituting the symbol pattern may be set in the pattern width range on the design rule, although the width is set equal to the lower limit vale of the pattern width range on the design rule with respect to the same layer in the embodiment described above. If the width of the element pattern is in the pattern width range on the design rule, the flatness of the upper surface can be guaranteed. Generally, the process condition contains some margin. It is therefore possible to guarantee the flatness of the upper surface, if a difference is small between the width of the element pattern and the higher or lower limit value of the pattern width range on the design rule. Since it is sufficient that the shape of a symbol pattern can be recognized, the width of the element pattern constituting the symbol pattern is not as severe as that of the device pattern. Therefore, the width of the symbol pattern may be equal to or larger than 0.8 time the lower limit value and equal to or smaller than 1.2 times the upper limit value of the pattern width range on the design rule.

The minimum value of the distance between element patterns constituting the symbol pattern may be equal to or larger than 0.8 time the minimum interval on the design rule.

If the symbol pattern is formed with high priority on visibility, the line width of the symbol pattern is preferable to be, for example, about 2 μm. Therefore, if the upper limit value of the pattern width range on the design rule is 1 μm or narrower, the width of the element pattern constituting the symbol pattern is likely to exceed the pattern width range on the design rule. If the maximum value of the pattern width on the design rule is 1 μm or smaller, the significant effects of the embodiment can therefore be expected.

With reference to FIGS. 2A to 5F, description will be made on various structural examples of the symbol pattern.

FIG. 2A shows an original pattern of an Arabic numeral "3" constituted of only straight line portions. The original pattern contains bending portions and a crossing portion. FIGS. 2B to 2D show examples of the symbol pattern corresponding to the original pattern shown in FIG. 2A. Each symbol pattern is constituted of only isolated linear patterns. The bending portion and crossing portion of the original pattern are configurated in the symbol pattern by disposing a plurality of straight line patterns in proximity to one another with some distance therebetween. The width of the straight line pattern constituting the symbol pattern is equal to the width of the straight line portion of the original pattern.

FIG. 2E shows an original pattern having a width wider than that of the straight line portion of the original pattern shown in FIG. 2A. FIGS. 2F to 2H show examples of the symbol pattern corresponding to the original pattern shown in FIG. 2E. One straight line portion of the prototype original is constituted of two linear patterns disposed in parallel to each other. If a width of the straight line portion of the original pattern exceeds the upper limit value of the pattern width range on the design rule, the width of the element pattern constituting the symbol pattern can be set in the allowable range, by forming one straight line portion of the original pattern by using a plurality of linear patterns disposed in parallel to each other.

FIG. 2I shows an original pattern of a letter "A" constituted of only straight line portions. As in the case shown in FIG. 2A, the original pattern representative of "A" contains bending portions and crossing portions. In the case shown in FIG. 2A, a bending angle and a crossing angle of the bending and crossing portions are 90°, whereas in the case shown in FIG. 2I, there are portions bending at an angle different from 90°. FIGS. 2J and 2K show examples of the symbol pattern corresponding to the original pattern shown in FIG. 2I. As in the cases shown in FIGS. 2B to 2D, the symbol pattern representative of the letter "A" is constituted of only isolated linear patterns.

FIG. 2L shows an original pattern having a width of the straight line portion wider than that of the original pattern shown in FIG. 2I. FIGS. 2M and 2N show examples of the symbol pattern corresponding to the original pattern shown in FIG. 2L. As in the cases shown in FIGS. 2F to 2H, one straight line portion of the original pattern is constituted of two linear patterns in the symbol pattern.

Figure 3A:
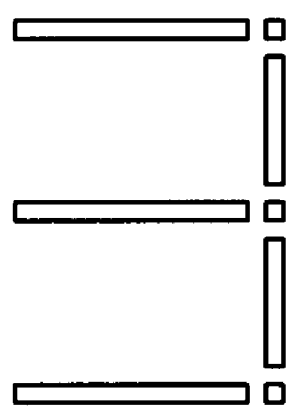
FIG. 3A is a symbol pattern representative of the original pattern shown in FIG. 2A.
Figure 3B:
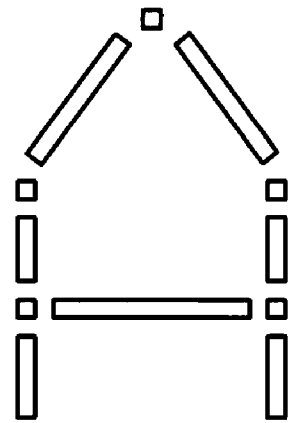
FIG. 3B is a symbol pattern representative of the original pattern shown in FIG. 2I.
Figure 3C:
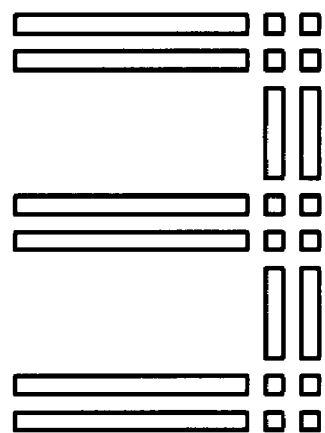
FIG. 3C is a symbol pattern representative of the original pattern shown in FIG. 2E.
Figure 3D:
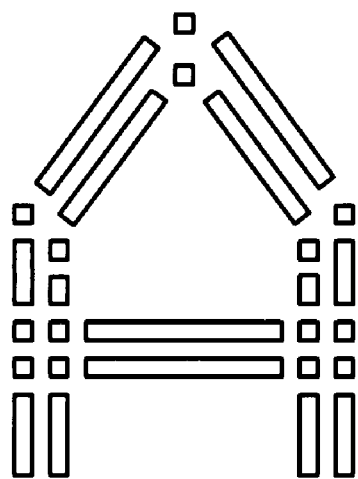
FIG. 3D is a symbol pattern representative of the original pattern shown in FIG. 2L.

FIG. 3A shows another example of the symbol pattern corresponding to the original pattern representative of "3" shown in FIG. 2A, and FIG. 3B shows another example of the symbol pattern corresponding to the original pattern representative of "A" shown in FIG. 2I. FIG. 3C shows another example of the symbol pattern corresponding to the thick original pattern representative of "3" shown in FIG. 2E, and FIG. 3D shows another example of the symbol pattern corresponding to the thick original pattern representative of "A" shown in FIG. 2L. In the examples shown in FIGS. 3A to 3D, isolated dot patterns are disposed at positions corresponding to the bending and crossing portions of the original patterns. An isolated linear pattern is disposed at the straight line portions other than the bending and crossing portions.

Since the dot patterns are disposed at the bending and crossing portions, the bending and crossing portions can be recognized easily. If a character represented by a symbol pattern is recognized through automatic pattern recognition, a recognition precision can be improved.

Figure 4A:
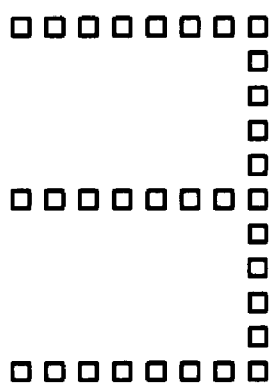
FIG. 4A is a symbol pattern representative of the original pattern shown in FIG. 2A.
Figure 4B:
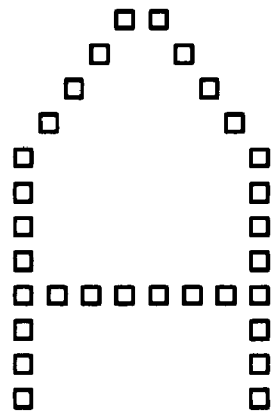
FIG. 4B is a symbol pattern representative of the original pattern shown in FIG. 2I.
Figure 4C:
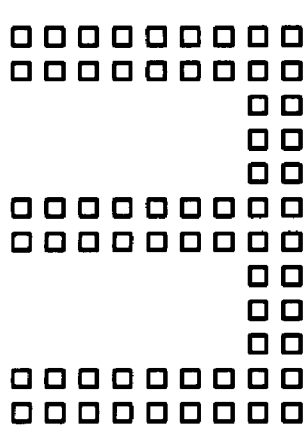
FIG. 4C is a symbol pattern representative of the original pattern shown in FIG. 2E.
Figure 4D:
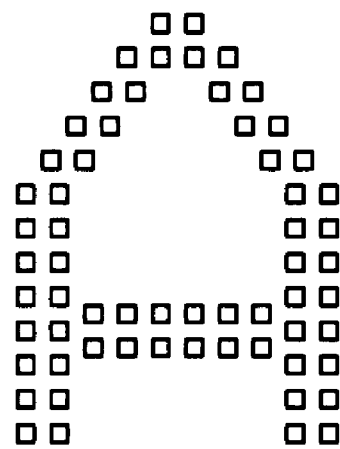
FIG. 4D is a symbol pattern representative of the original pattern shown in FIG. 2L.

FIG. 4A shows another example of the symbol pattern corresponding to the original pattern representative of "3" shown in FIG. 2A, and FIG. 4B shows another example of the symbol pattern corresponding to the original pattern representative of "A" shown in FIG. 2I. FIG. 4C shows another example of the symbol pattern corresponding to the thick original pattern representative of "3" shown in FIG. 2E, and FIG. 4D shows another example of the symbol pattern corresponding to the thick original pattern representative of "A" shown in FIG. 2L. In the examples shown in FIGS. 4A to 4D, the symbol pattern is formed only by dot patterns. If the device pattern in the same layer as that of the symbol pattern is formed only by dot patterns, the cross sectional shapes of the device and symbol patterns can be made more coincident by forming the symbol pattern only by dot patterns having the same size as that of the device pattern. For example, in the layer in which conductive plugs filling via holes are included, only dot patterns are disposed as the device pattern.

Figure 5A:
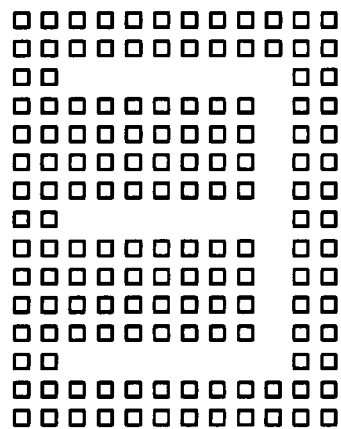
FIGS. 5A, 5C and 5D are symbol patterns representative of the original pattern shown in FIG. 2A, and FIGS. 5B, 5E and 5F are symbol patterns representative of the original pattern shown in FIG. 2I.
Figure 5B:
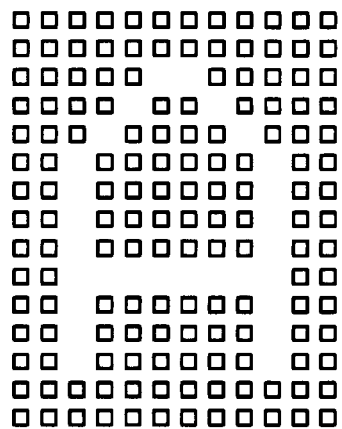
Figure 5C:
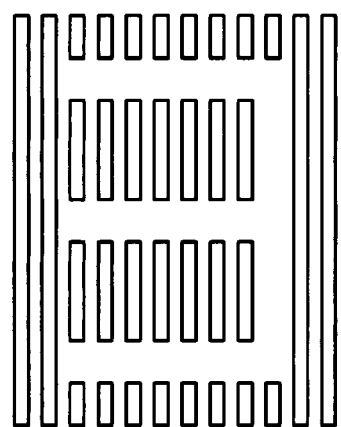
Figure 5D:
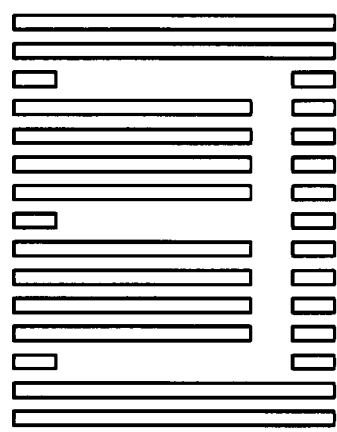
Figure 5E:
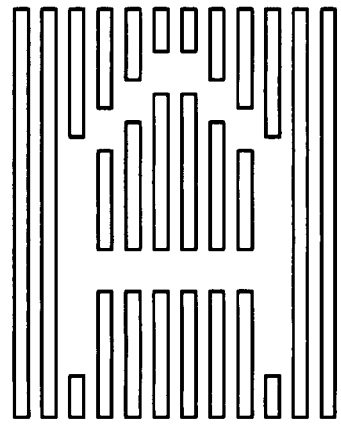
Figure 5F:
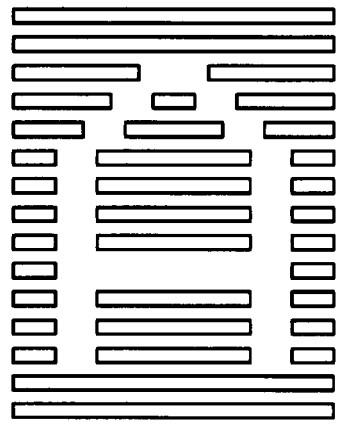

FIG. 5A shows another example of the symbol pattern corresponding to the original pattern representative of "3" shown in FIG. 2A, and FIG. 5B shows another example of the symbol pattern corresponding to the original pattern representative of "A" shown in FIG. 2I. Some of dot patterns disposed regularly in a matrix shape are removed. The region from which the dot patterns are removed corresponds to the original pattern. For the symbol patterns shown in FIGS. 5C to 5F, some of linear patterns disposed in parallel at an equal pitch are removed to form the original pattern. A symbol pattern forming the original pattern by a region from which some of element patterns distributed regularly are removed in the way described above, is called a "reversed pattern".

It can be understood from the comparison between FIGS. 4A and 5A that distribution densities of dot patterns is different although the same original pattern is displayed. Similarly, it can be understood from the comparison between FIGS. 2B and 5C that distribution densities of linear patterns is different although the same original pattern is displayed. A pressure by a polishing pad is concentrated during CMP upon an insulating film isolating copper wirings in the region where the copper wirings are dense. Therefore, the upper surfaces of the insulating film and copper wirings in the dense region of copper wirings are likely to be depressed more than those in the coarse region of copper wirings. This depression is called erosion. Erosion occurs also in the region where symbol patterns are disposed depending upon the distribution densities of dot patterns and linear patterns.

Generally, CMP conditions are set to make erosion hard to occur in the region where device patterns are disposed. It is therefore preferable that a distribution density of element patterns in the region where symbol patterns are disposed is set near that of device patterns. It is possible to selectively adopt an ordinary pattern or a reversed pattern as the symbol pattern, in accordance with a distribution density of device patterns.

Next, with reference to FIGS. 6 to 7B, description will be made on the positions at which a symbol pattern is disposed.

Figure 6:
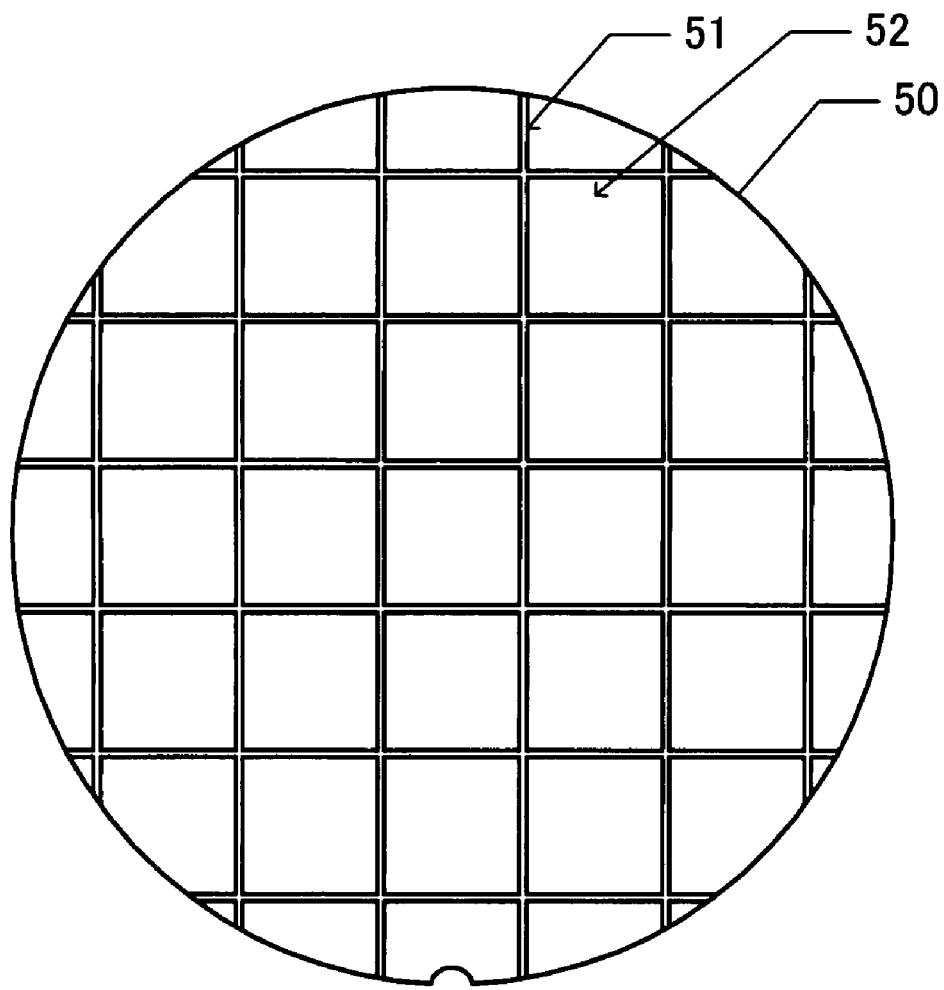
FIG. 6 is a plan view of a semiconductor wafer.

FIG. 6 is a plan view of a semiconductor wafer 50. Scribe lines 51 disposed in an orthogonal lattice shape are defined on the surface of the semiconductor wafer 50. A plurality of chip regions 52 partitioned by the scribe lines 51 are defined. Device patterns are disposed in each chip region 52. After the completion of wafer processes, the semiconductor wafer 50 is cut along the scribe lines 51 to be separated into a plurality of chips 52.

In an example shown in FIG. 7A, symbol patterns 6 and 20c are disposed in a scribe line 51. In an example shown in FIG. 7B, symbol patterns 6 and 20c are disposed in a chip region 52. In this way, symbol patterns may be disposed either in the scribe line or in the chip region.

Figure 8:
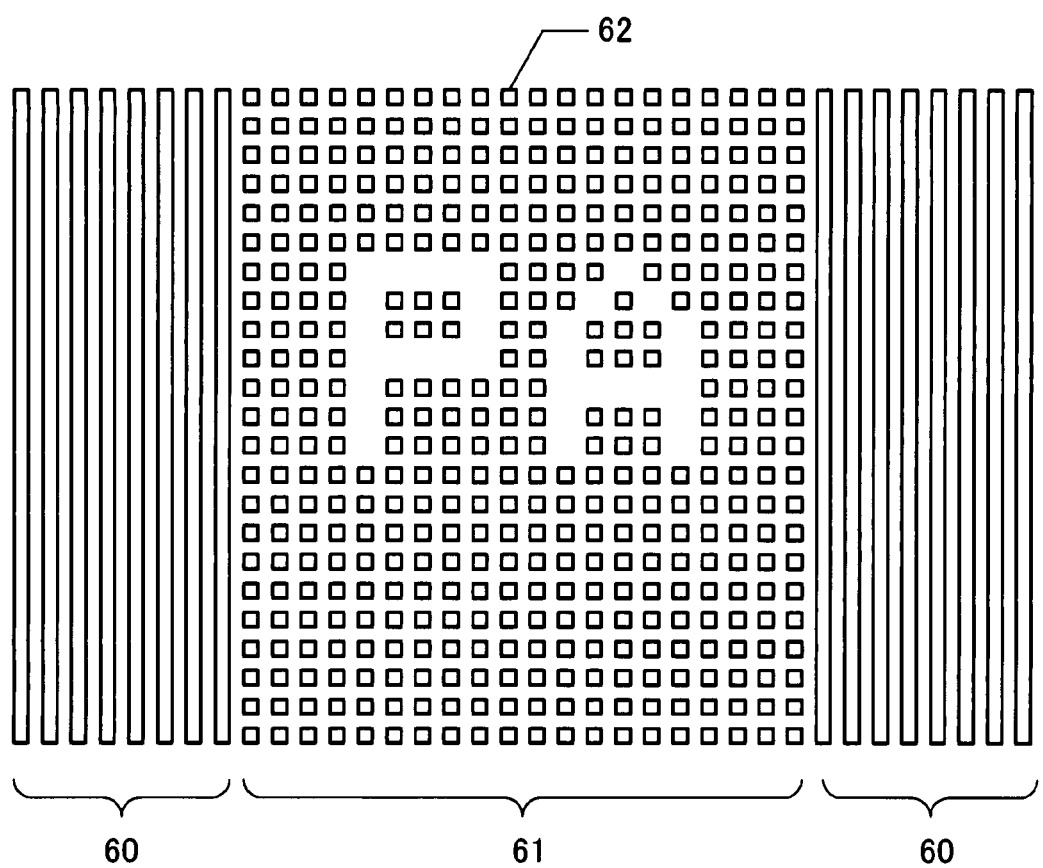
FIG. 8 is a plan view showing a symbol pattern and wiring patterns, the symbol pattern being formed by using dummy patterns.
Figure 9A:
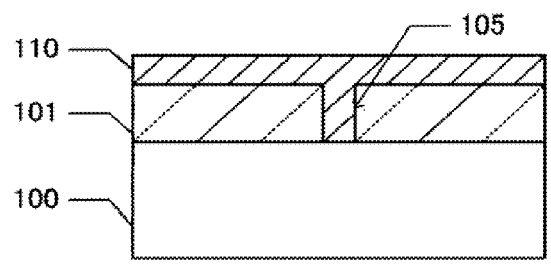
FIGS. 9A and 9C are cross sectional views of a device pattern region of a semiconductor device during a manufacture of the semiconductor device according to a prior art.
Figure 9B:
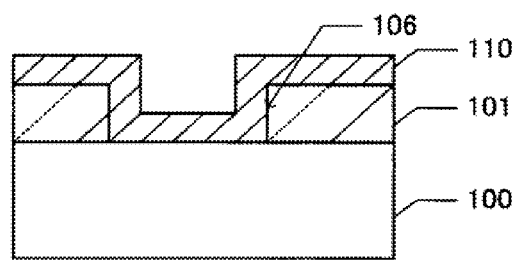
FIGS. 9B and 9D are cross sectional views of a symbol pattern region during the manufacture of the semiconductor device according to a prior art.
Figure 9C:
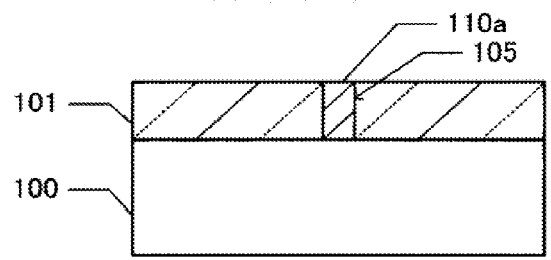
Figure 9D:
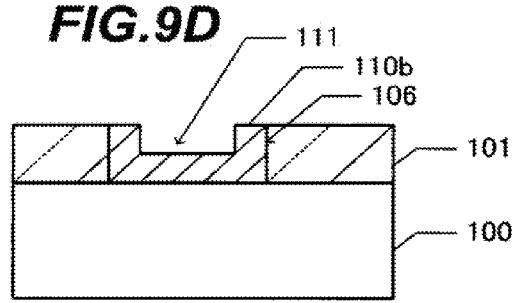

FIG. 8 shows an example in which symbol patterns are disposed in a chip region. Two regions 60 where copper wirings are distributed densely are defined in the chip region. A region 61 where copper wirings are not distributed is defined between two regions 60. In order to make uniform a polishing speed during CMP in the substrate in-plane, dummy patterns 62 are disposed in the region 61 where copper wirings are not distributed. For example, each dummy pattern 62 is a dot pattern disposed regularly in a matrix shape. Reversed patterns are formed by removing some of the regularly disposed dummy patterns 62. In this case, the dummy patterns 62 serve also as element patterns constituting the symbol patterns.

By making the dummy patterns serve also as element patterns constituting symbol patterns in this way, the identification signs can be formed without reserving a region intended for exclusive use with symbol patterns.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device comprising:
    a plurality of device patterns constituting part of an electronic circuit formed over a surface of a substrate; and
    a symbol pattern to be used for an identification sign formed in a same layer as the device patterns, the symbol pattern representing an original pattern corresponding to the identification sign;
    wherein the original pattern contains a straight line portion; and
    wherein a width of the device pattern is within a pattern width range on a design rule, the symbol pattern is formed by a plurality of isolated element patterns, each element pattern is a linear pattern, and a width of the element pattern is equal to or larger than 0.8 times a lower limit value of the pattern width range on the design rule and equal to or smaller than 1.2 times an upper limit value of the pattern width range on the design rule, the straight line portion of the original pattern is represented by at least two element patterns of the isolated element patterns, the two element patterns being disposed in parallel to each other.

2. The semiconductor device according to claim 1, wherein a minimum interval between adjacent ones of the plurality of element patterns is equal to or larger than 0.8 times a minimum interval between adjacent ones of the plurality of device patterns.

3. The semiconductor device according to claim 1, wherein the upper limit value of the pattern width range on the design rule is 1 µm or smaller.

4. The semiconductor device according to claim 1, wherein the substrate is a wafer before separated into chips, a plurality of device regions partitioned by scribe lines are defined on a surface of the wafer, the device pattern is disposed in the device region, and the symbol pattern is disposed in the scribe line.

5. The semiconductor device according to claim 1, wherein the original pattern contains a bending portion or a crossing portion, and the symbol pattern has a dot pattern disposed at a position corresponding to the bending portion or the crossing portion of the original pattern.

6. The semiconductor device according to claim 1, wherein the device pattern and the element patterns of the symbol pattern comprises members filling recesses formed in a surface layer of the substrate.

7. A semiconductor device comprising:
    a plurality of device patterns constituting part of an electronic circuit formed over a surface of a substrate; and
    a symbol pattern to be used for an identification sign formed in a same layer as the device patterns, the symbol pattern representing an original pattern corresponding to the identification sign;
    wherein the original pattern contains a bending portion or a crossing portion; and
    wherein a width of the device pattern is within a pattern width range on a design rule, the symbol pattern is formed by a plurality of isolated element patterns, each element pattern is a linear pattern or a dot pattern, and a width of the element pattern is equal to or larger than 0.8 times a lower limit value of the pattern width range on the design rule and equal to or smaller than 1.2 times an upper limit value of the pattern width range on the design rule; and
    wherein the original pattern corresponding to the identification sign is represented by a shape of a region where a plurality of element patterns constituting the symbol pattern are not disposed.

* * * * *